United States Patent
Roberts

(10) Patent No.: US 6,853,967 B1
(45) Date of Patent: Feb. 8, 2005

(54) METHOD AND APPARATUS FOR CALCULATING INTERCONNECT NOISE DUE TO CROSS CAPACITANCE IN THE PRESENCE OF LINE RESISTANCE

(75) Inventor: Ben D. Roberts, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,262

(22) Filed: Dec. 30, 1999

(51) Int. Cl.[7] .............................. G06F 17/50; G06F 9/45
(52) U.S. Cl. ........................................ 703/14; 716/10
(58) Field of Search ............................... 703/14; 716/10

(56) References Cited

U.S. PATENT DOCUMENTS

| | | | | |
|---|---|---|---|---|
| 5,729,466 A | * | 3/1998 | Bamji ........................ | 716/10 |
| 5,983,006 A | | 11/1999 | Carlson et al. | |
| 6,028,989 A | * | 2/2000 | Dansky et al. ................ | 716/8 |
| 6,128,769 A | | 10/2000 | Carlson et al. | |
| 6,192,330 B1 | * | 2/2001 | Nakamura ................... | 703/13 |
| 6,314,546 B1 | * | 11/2001 | Muddu .......................... | 716/5 |
| 6,396,256 B1 | * | 5/2002 | Arsenault et al. ......... | 324/158.1 |

OTHER PUBLICATIONS

"Modeling the Driving–Point Characteristics of Resistive Interconnect for Accurate Delay Estimation", Peter R. O'Brien and Thomas L. Savarino, IEEE 1989, pp. 512–515.*

Modeling The Driving–Point Characteristics of Resistive Interconnect For Accurate Delay Estimation, pp. 512–515, 1989 IEEE , Peter O'Brien and Thomas L. Savarino.

The Transient Response of Damped Linear Networks With Particular Regard to Wide–Band Amplifiers, Jour. Appl. Physics, vol. 19, No. 1, pp. 55–63, Jan. 1948, W.C. Elmore.

An Extension of Elmore's Delay, IEEE Trans. Circuits and Systems, vol. CAS–33, No. 11, pp. 1147–1149, Nov. 1986, P.K. Chan.

Pak K. Chan, "An Extension of Elmore's Delay and It's Application For Timimg Analysis of MOS Pass Transistor Networks", IEEE Transactions On Circuits and Systems, vol. CAS–33, No. 11, Nov. 1986.

* cited by examiner

Primary Examiner—Kevin J. Teska
Assistant Examiner—Dwin Craig
(74) Attorney, Agent, or Firm—Blakely, Sokoloff, Taylor & Zafman LLP

(57) ABSTRACT

A method that creates a string that models a trace, the string having a collection of lumped elements, where at least one of the lumped elements has a cross capacitor. The method reduces the string to a pi model where the pi model has a cross capacitor. The method simulates the application of an applied noise voltage to the cross capacitor.

63 Claims, 12 Drawing Sheets

(applied noise voltage) at the source end (applied noise voltage) at the load end

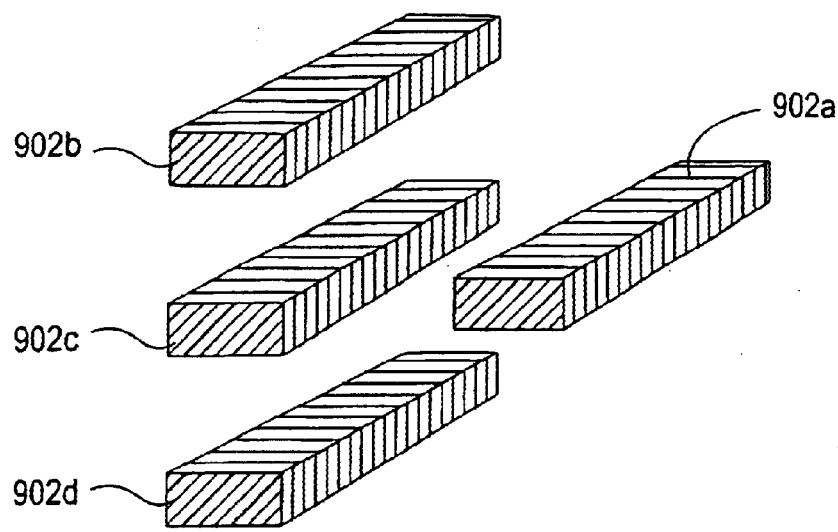
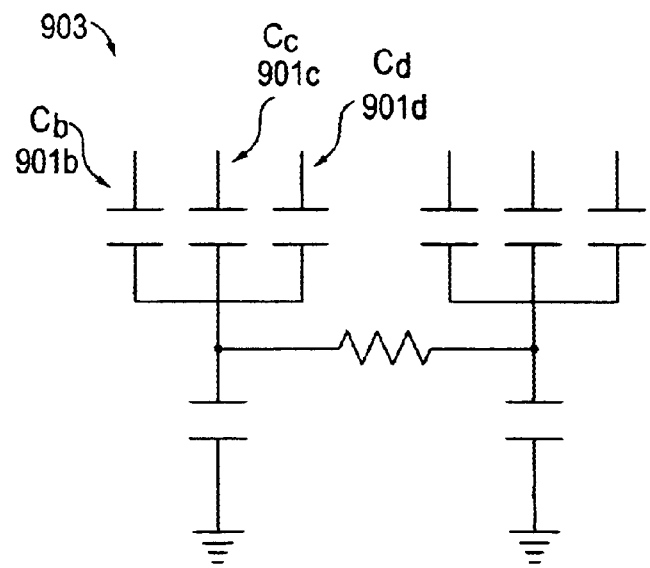
Fig. 9A
Fig. 9B
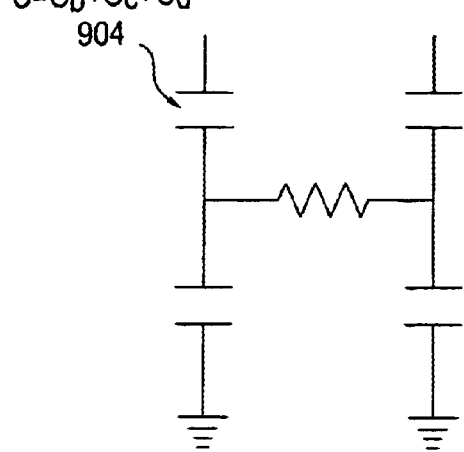
Fig. 9C

METHOD AND APPARATUS FOR CALCULATING INTERCONNECT NOISE DUE TO CROSS CAPACITANCE IN THE PRESENCE OF LINE RESISTANCE

FIELD OF INVENTION

The field of the invention relates to electronic circuit simulation. More specifically, the field of invention relates to simplifying the simulation for cross capacitance noise applications.

BACKGROUND OF THE INVENTION

Cross Capacitance Noise

Noise is any deviation from a preferred or ideal signal. Applied noise voltages generate undesired voltages or currents (i.e., noise) into a node which affect an otherwise preferred or ideal signal. Multiple noise sources exist within a semiconductor IC (such as AC ripple on the power rails or thermal noise from resistive elements). Another form of noise, referred to as cross capacitance noise (referred to also as cross coupling noise or interconnect noise), occurs where neighboring signal traces are the noise source. Semiconductor ICs employ metal traces (also referred to as interconnects or interconnect traces) in order to electrically connect transistors. FIG. 1a shows a section of two neighboring metal traces 101a, 102a. Typically, the metal traces 101a, 102a are separated and surrounded by dielectric material(s) (not shown).

The combination of a dielectric sandwiched between two conducting traces forms a cross capacitor between the two traces. Thus, simply placing two interconnect traces 101a, 102a near each other forms a cross capacitor. The interconnect traces 110a, 102a may therefore be modeled as lumped elements 101b, 102b as shown in FIG. 1b. That is, a single length of neighboring traces may be viewed as sharing a pair of cross capacitances 108, 109 each having one half the total capacitance between the particular trace length. Each trace 101b, 102b also has an associated series resistance 110, 111. The model of FIG. 1b is typical of models used to predict circuit performance.

Capacitances are generally viewed as short circuits for AC signals. Thus a sudden time varying signal on a trace (e.g., time varying signal 112 on trace 101b) typically causes noise current 113 to travel from the trace 101b to the neighboring trace 102b. This noise current 113, in turn, causes a voltage perturbation 114 on the neighboring trace 102b. The voltage perturbation 114, when added to any signal on the neighboring trace 102b is typically referred to as cross capacitance noise.

As device size continues to shrink (resulting in higher and higher levels of metallization) cross capacitance problems are becoming more severe. The wafer substrate in which devices are embedded is usually grounded so the wafer substrate may be seen as a large ground plane beneath the various pairs of cross-coupled traces. This plane tends to absorb electrical flux lines emanating from the interconnect traces which decrease the cross-capacitance noise. The relationship between the interconnect traces and the grounded wafer (or to signals on other layers) may be modeled as substrate capacitances 115a, b, 116a, b.

However, the beneficial effect of the grounded wafer is diminished at higher and higher metallization levels simply because of the increased height of the metal traces above the wafer. Thus, with higher levels of metallization (necessary to interconnect the expanding number of devices per die), the industry is experiencing more severe cross capacitance noise problems.

Circuit Modeling

Due to the expense associated with manufacturing semiconductor chips and the competitive nature of the marketplace, it is desirable to have chips yielding (i.e., the manufacture of working chips suitable for customer shipment) with the fewest development process runs possible. In order to achieve this, chip designs are typically simulated by a computing system prior to fabrication. Design defects are discovered during the simulation and the design is fixed accordingly. The time and expense saved simulating chip designs, as compared to the alternative approach of making the chip and debugging its design defects, is considerable.

Given the above described worsening of cross-capacitance noise, it is desirable to simulate its effects. However, a discussed, the noise sources associated with cross capacitance noise are neighboring signals and trace geometries. Given the highly complex relationship (in terms of timing, strength, distances, etc.) between the various signals running over traces, the various geometries between neighboring traces as well as the sheer number of signals and traces, it is extremely cumbersome to completely model these effects.

Specifically, use of SPICE modeling techniques in combination with lumped element models (such as that shown in FIG. 1b) requires too much time to simulate. Each trace bend, branch or via creates a new lumped element that must be added to the trace model. A single trace is modeled as a complicated string of lumped elements, each requiring dedicated attention during the simulation. Furthermore, SPICE modeling is an iterative process meaning each of the multiple lumped elements per trace must receive dedicated attention a plurality of times before the simulation is complete. Given the vast number of traces existing within a semiconductor IC, it is simply too inefficient to simulate cross capacitance noise in this manner.

SUMMARY OF THE INVENTION

A method is described that creates a string that models a trace, the string having a collection of lumped elements, where at least one of the lumped elements has a cross capacitor. The method then reduces the string to a pi model where the pi model has a cross capacitor. The method then simulates the application of an applied noise voltage to the cross capacitor.

BRIEF DESCRIPTION OF THE DRAWINGS

The present invention is illustrated by way of example and not limitation in the figures of the accompanying drawings, in which like references indicate similar elements, and in which:

FIG. 9A shows proximate conducting traces.

FIG. 9B shows a model for the proximate conducting traces of FIG. 9A.

FIG. 9C shows an approximated model of the model shown in FIG. 9B.

DETAILED DESCRIPTION

A method is described that creates a string that models a trace, the string having a collection of lumped elements, where at least one of the lumped elements has a cross capacitor The method then reduces the string to a pi model where the pi model has a cross capacitor. The method then simulates the application of an applied noise voltage to the cross capacitor.

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

For example, although the background section alluded mostly to integrated circuits (i.e., silicon chips), the following discussion is perfectly applicable to PC board (also referred to as planar board) technology. Thus, the following discussion is applicable not only to interconnections between transistors on a chip but also to interconnections between silicon chips on a board having a plurality of chips affixed thereto.

Figure 1A:
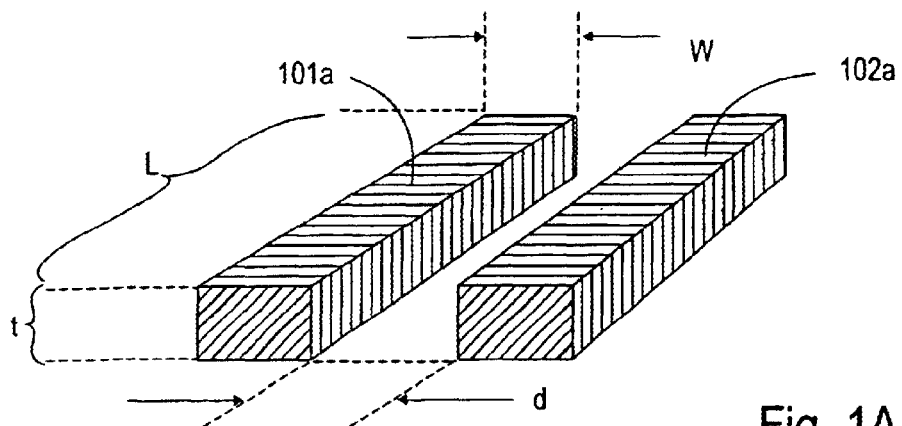
FIG. 1A is a depiction of two neighboring traces.

Given a trace requiring simulation, a lumped element model of the trace (also referred to as a trace model or string) is created. A lumped element model of a trace is a collection of lumped elements. A lumped element is a model that corresponds to an important geometrical or electrical feature of the trace (such as a straight length, a bend, a via, a stub, a resistor, a capacitor, an inductor, etc.) Thus, every trace bend, branch or via creates a new lumped element that must be added to the trace model. In order to simulate the effects of cross capacitance noise, each lumped element generally has associated cross capacitances where such cross capacitances exist. Each lumped element is typically a re presentation of the series resist ance, trace to wafer (or other layer) capacitance and cross capacitance associated with that portion of the trace. For example lumped element 101b of FIG. 1 has series resistance 110, substrate capacitances 115a, b and cross capacitances 108, 109. Various geometries result in various capacitance and resistance values, thus lumped element values should vary accordingly.

Figure 1B:
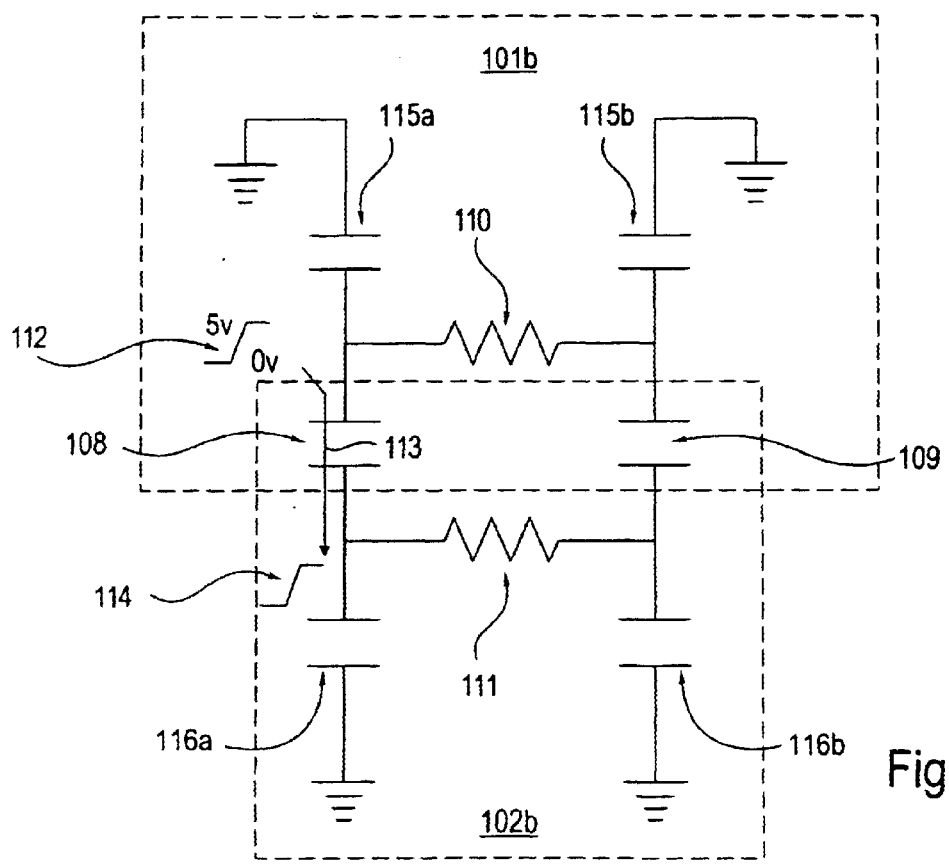
FIG. 1B is a model of the neighboring traces of FIG. 1A.

Calculating the specific resistance values follow from Equation 1:

$$R = \frac{\rho L}{A} \qquad \text{Equation 1}$$

where R is resistance, ρ is the resistivity of the trace material, L is the length of the trace and A is the cross sectional area of the trace (w x t in FIG. 1). The cross capacitance for two parallel conducting strips is usually given by:

$$C = \frac{\epsilon t L}{d} \qquad \text{Equation 2}$$

where ε is the dielectric constant of the dielectric between the traces 101a, 102a and d is the spacing between the traces 101a, 102a. Other additional relationships may be used as geometries dictate. For example, correction terms may be added to account for field fringing.

Figure 2A:
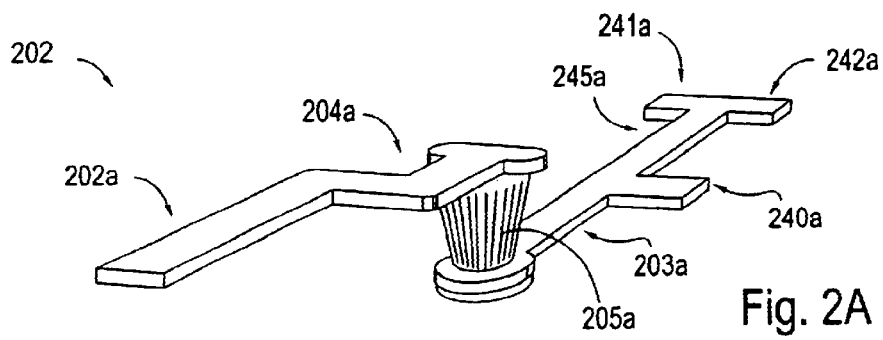
FIG. 2A is a depiction of a trace layout.
Figure 2B:
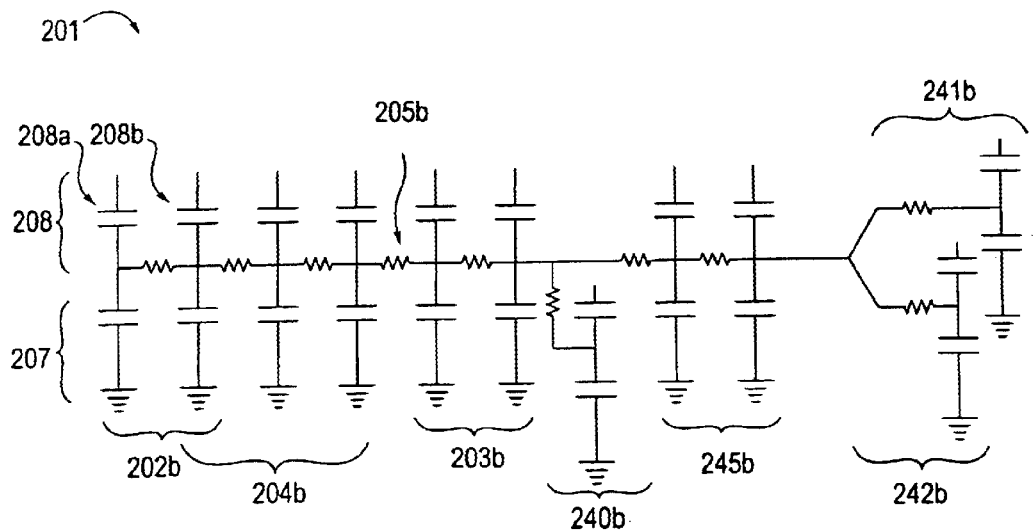
FIG. 2B is a string that models the trace of FIG. 2A.

A lumped element model of the trace is frequently a complicated string of lumped elements because of all the stubs, vias, etc. Thus a lumped element model of a trace may also be referred to as a string. Such a string 201 is shown in FIG. 2b. The string 201 is a model of the circuit trace 202 of FIG. 2a. The circuit trace 202 of FIG. 2a has three fixed lengths 202a, 203a, 245a, a bend 204a, a via 205a, and stubs 240a, 241a, 242a. Each of these have an associated lumped element model 202b, 203b, 245b, 204b, 205b, 240b, 241b, and 242b as shown in FIG. 2b.

Note that stubs 240a, b, 241a, b and 242a, b are typically a load (such as a down stream logic gate input) that the source must drive. Also note the collection of cross capacitances 208. These are the aforementioned cross capacitances between each of the lumped elements and a neighboring trace (not shown in FIG. 2A). There is also a collection of substrate capacitances 207. These are aforementioned capacitances between each of the lumped elements and the grounded wafer substrate or lower grounded layers. The substrate capacitances 207 tend to diminish at higher metal layers resulting in greater impedance to ground for cross capacitance noise. As such cross capacitance noise remains on higher metal layer traces rather-than shorted to ground. Note the fixed length lumped element 202b has overlapping capacitance with the bend lumped element 204b. This results from the fact that parallel capacitances add. That is, fixed length lumped element 202b has its own capacitance neighboring the bend lumped element 204b. The bend lumped element 204b has its own capacitance neighboring the fixed length element 202b. This results in neighboring (i.e., parallel) capacitances which may be added together.

Figure 2C:
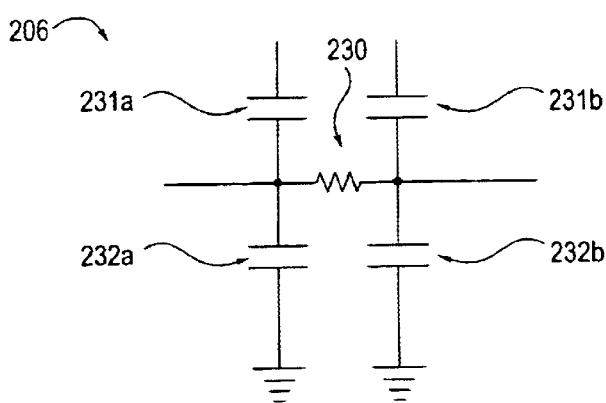
FIG. 2C is a single Pi model reduced from the string of FIG. 2A.

As discussed, strings (e.g. string 201) complicate the simulation process. In order to reduce these complications a simplified model of the string may be used. For example, the entire string 201 of FIG. 2b may be reduced to a single Pi model 206 (also referred to, among others, as a simple Pi model or Pi model or equivalent Pi) as shown in FIG. 2c. Note that the Pi model 206 has a series resistance 230, a pair of cross capacitances 231a, b and a pair of substrate capacitances 232ab. Generally, there is some loss of Accuracy when converting the model from a string (such as string 201) to Pi model 206. However, the loss of accuracy is acceptable for practical application and the savings in simulation time outweighs the accuracy loss.

As simplification method is used to convert the string 201 to a Pi model 206. A simplification method is any process used to reduce the number of lumped elements in a string Two simplification embodiments are described here: an "Elmore influenced" simplification method and an "O'Brien/Savarino influenced" simplification method. An Elmore influenced simplification method adds cross capacitance considerations to earlier work done by Elmore (W. C. E₁ more, "The Transient Response of Damped Linear Networks with Particular Regard to Wide-Band Amplifiers," Jour. Appl. Physics, vol. 19, no. 1, pp. 55–63, January, 1948). An O'Brien/Savarino influenced simplification method adds cross capacitance considerations to earlier work done by O'Brien and Savarino. (P. R. O'Brien and T. L. Savarino, "Modeling the Driving-Point Characteristic of Resistive Interconnect for Accurate Delay Estimation," IEEE International Conference on Computer-Aided Design, Digest of Technical Papers pp. 512–515, 1989). Other simplification embodiments may be obtained from basic circuit derivations. Simplification methods as discussed may be implemented in software in order to increase design time efficiency.

An Elmore Influenced Simplification Method

Figure 3A:
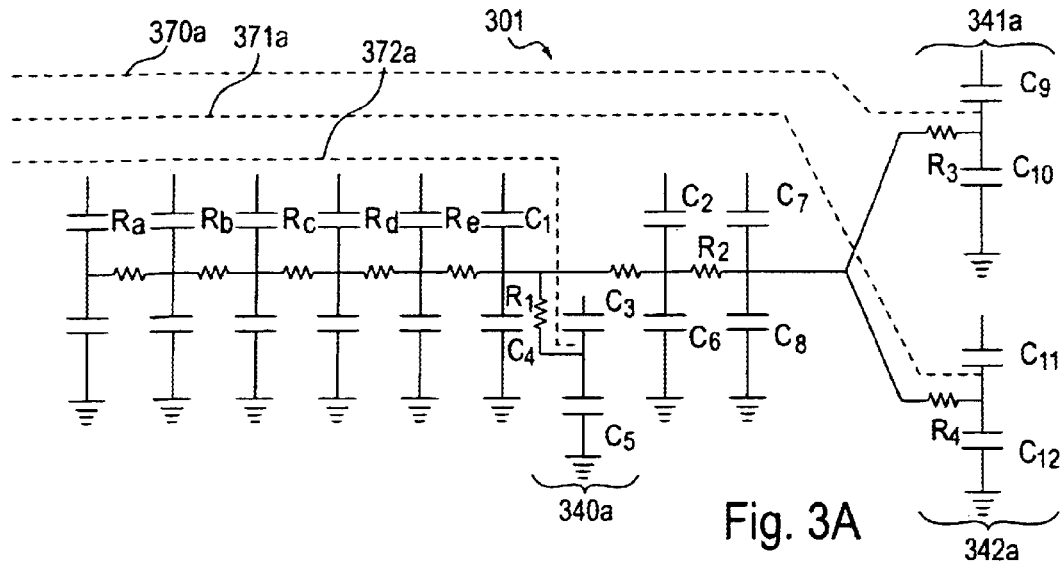
FIG. 3A is a string that models the trace of FIG. 2A.

As discussed, various traces may be complicated. For example a trace may be driven by a single driver and then fanned out to multiple receivers (or loads). This results in multiple stubs stemming from the main trace to each load. A lumped element model of a trace 301 (also referred to as a string) is shown in FIG. 3a. For simplicity, the string 301 is the same string shown back in FIG. 2b. Next described is the process of reducing the string 201 of FIG. 2b to the pi model 206 of FIG. 2c. It should be understood that much of the discussion herein, not only for the Elmore influenced simplification method but also for the specification as a whole, employs the use of specific examples. These should not be construed to limit the invention to these specific examples as they are provided for understanding the broader scope of the invention itself.

Usually, each load has its own unique stub that branches from the main trace and makes contact to the load device. As a result, in one embodiment a preliminary step in the method is to identify the number of different paths existing within the trace. A path is a unique series of lumped elements between a source and a load (or other terminating point). Thus, for, traces having fan out (i.e., more than one load) there is typically one path per load. For example, a trace having a single source and a fan out of ten will typically result in ten unique paths. Each path is simplified separately, resulting in a single pi model for each path. Thus, a unique pi model is created for each unique source/load relationship. Some nets may also have more than one driver. In this case a unique path and pi model is created for each source and its relationship with each load. Simulations are typically performed on a per path basis.

In an embodiment, once each path is identified, a single pi model is created for that path. As an example, in FIG. 3a, there are three loads 340a, 341a, 342a in string 301, resulting in three paths 370a, 371a, 372a. Analyzing one path at a time, in one approach, stubs (or loads) not associated with the particular path being analyzed are eliminated. This may be accomplished by approximating the stub resistances as having zero resistance. Thus, using path 370a as an example, stub resistances R and R₁ are set to zero. The circuit simulation error introduced by this approximation increases with the length of the stub. That is, as stub length grows, so too does its resistance. Nevertheless, for trace metallurgy comprising aluminum through $SiO_2$, the approximation has shown to be acceptable for stubs at least 5 mm or less. For other materials such as Copper (Cu) and/or low dielectric constant insulators, the stubs should be greater than 5 mm.

Once the stub/load resistances have been approximated as zero, a reduced string 355 (again using the analysis of path 370a as an example) having groups of parallel capacitors (such as parallel capacitor groups 353, 354, 356, 357) will result. A reduced string is a derivative of a string, having less components (e.g. resistors or capacitors) than the string. As parallel capacitance adds, the associated capacitances within each group may be added to form a single capacitor per group. The result is simple string 358 shown in FIG. 3c. Simple strings 358 appear as lumped elements of simple trace lengths. That is, simple strings are strings having alternating capacitances and resistances. Again, one simple string exists for each path.

Once the simple string 358 is created, it may be reduced using an Elmore influenced reduction process. For one embodiment, the Elmore influenced reduction process is defined by FIG. 4 in combination with Equations 3a-e. Sections (e.g., section 359 of simple string 358 shown back in FIG. 3c) having two resistances 401, 402 and six capacitors 403, 404, 405, 406, 407, 408, such as that shown in FIG. 4a, may be reduced to one resistor 409 and four capacitances 410, 411, 412 and 413 as shown in FIG. 4b. The equations are given below:

$$C_{xdnew} = C_{xd} + C_{xm}\left[\frac{R_2}{R_1 + R_2}\right] \quad \text{Equation 3b}$$

$$C_{ldnew} = C_{ld} + C_{lm}\left[\frac{R_2}{R_1 + R_2}\right] \quad \text{Equation 3c}$$

$$C_{xrnew} = C_{xr} + C_{xm}\left[\frac{R_2}{R_1 + R_2}\right] \quad \text{Equation 3d}$$

$$C_{lrnew} = C_{lr} + C_{lm}\left[\frac{R_2}{R_1 + R_2}\right] \quad \text{Equation 3e}$$

Figure 3B:
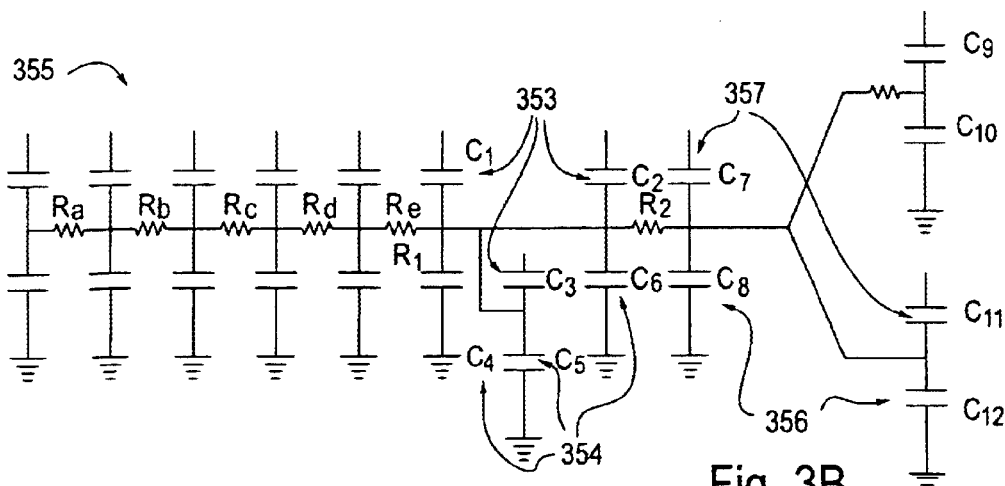
FIG. 3B is a reduced string created from the string of FIG. 3A according to the Elmore influenced method.
Figure 3C:
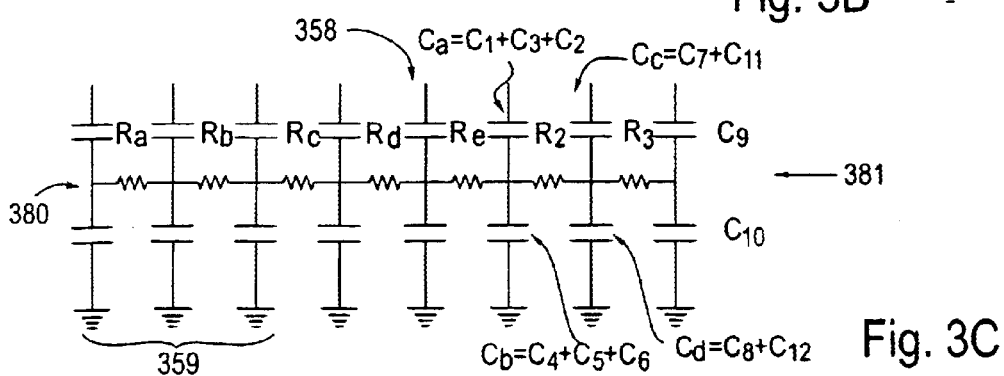
FIG. 3C is a simple string created from the second string of FIG. 3B.
Figure 4A:
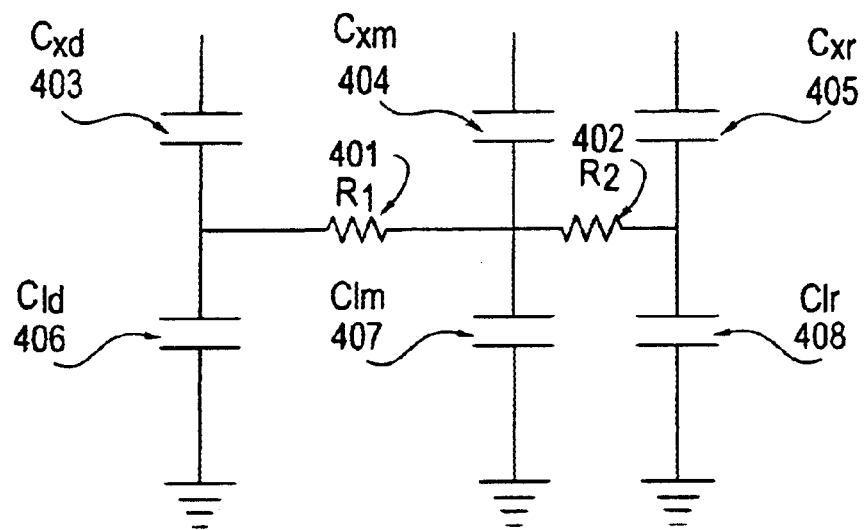
FIG. 4A shows a section of a simple string.
Figure 4B:
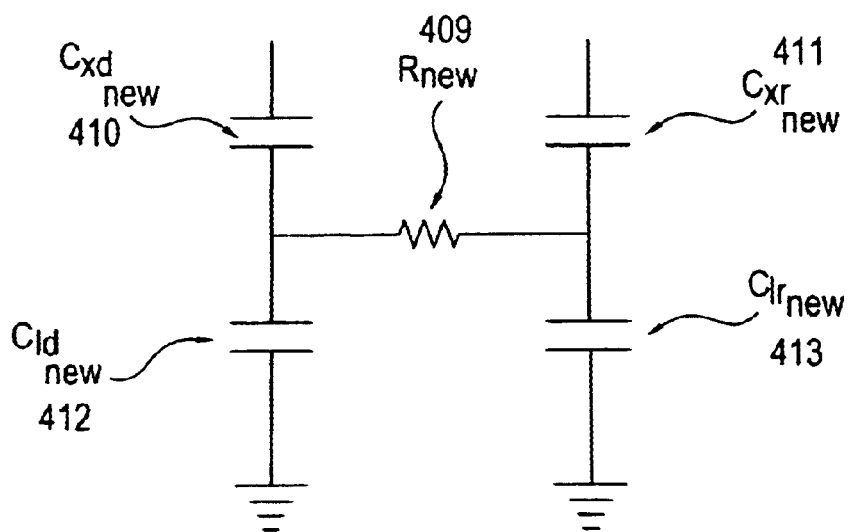
FIG. 4B shows a reduction of the section of FIG. 4A.

The reduced model 414 of FIG. 4b replaces the original components in the corresponding section 359 of the simple string 358 of FIG. 3c. The process is repeated until a simple pi model is left. That is, typically, the process is started at one end (source 380 or load 381 of FIG. 3c) of the simple string 358. After each reduction process (which involves new calculations for the new resistor and four capacitors), the simple string is further collapsed toward the other end. Eventually, the simple string is reduced to a pi model.

An O'Brien/Savarino Influenced Simplification Method

Another simplification method is based on the method of O'Brien and Savarino. In one approach, the O'Brien/Savarino influenced method calculates the net admittance at the driver. Similar to the Elmore influenced simplification method, the O'Brien/Savarino influenced simplification method allows the net to be collapsed to a single Pi equivalent with separate cross capacitors (such as that shown in FIG. 2c).

The original O'Brien/Savarino method traverses a net calculating downstream admittance by matching higher moments. Matching moments is equivalent to matching coefficients of S in a Taylor expansion of the downstream admittance. In one embodiment it is applied starting from the receiver load, working toward the driver.

Figure 5A:
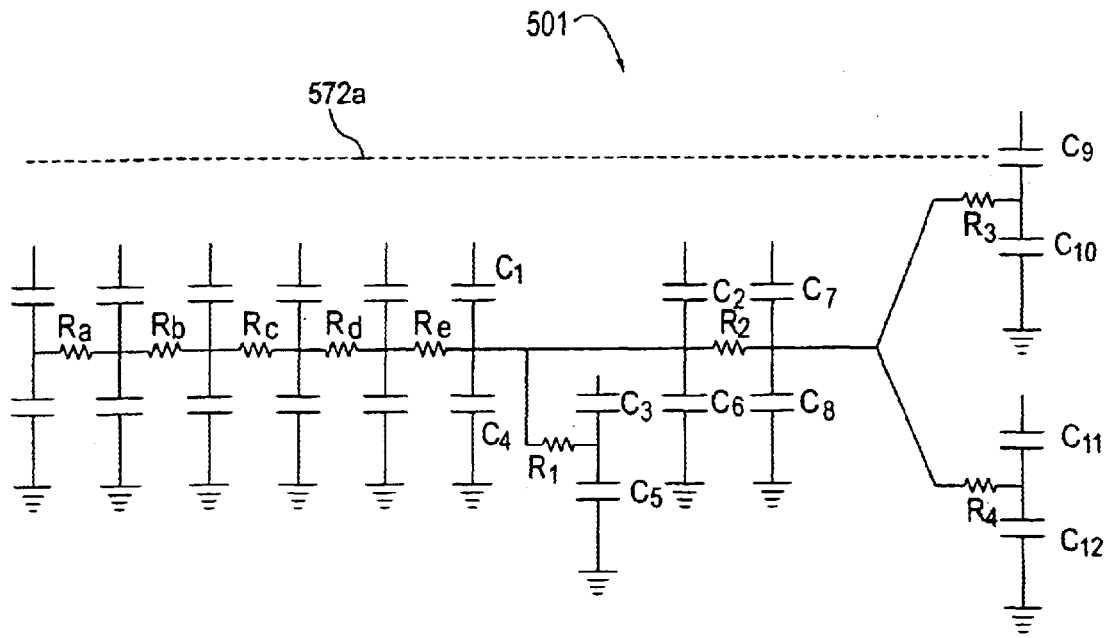
FIG. 5A is a string that models the trace of FIG. 2A.
Figure 5B:
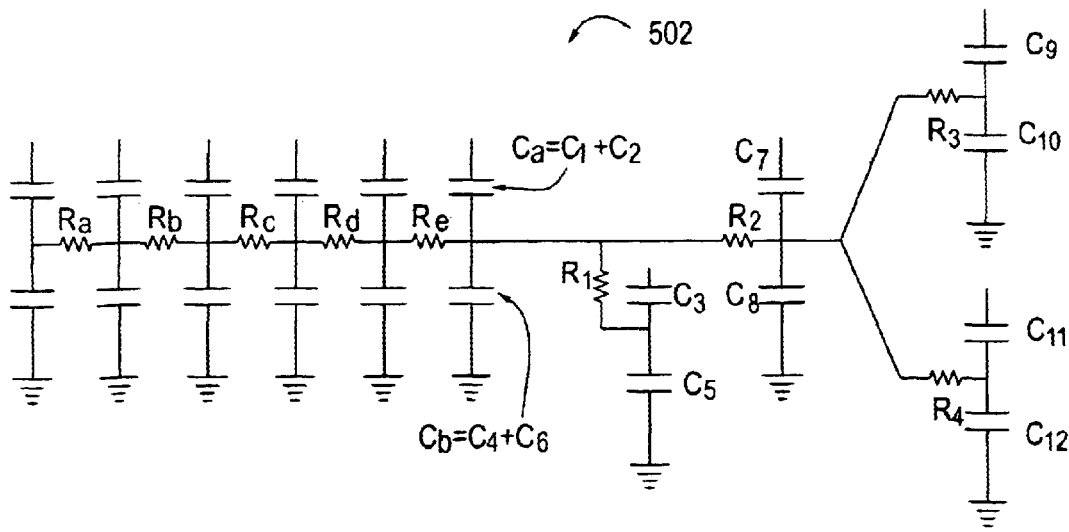
FIG. 5B is a reduced string created from the string of FIG. 5A according to the O'Brien/Savarino influenced method.

Again, a unique path may be identified for each unique source/load pair (or other terminating point) of a trace. Then each path is reduced to a single pi model. However, as discussed, in this embodiment the O'Brien/Savarino influenced method starts at the load and reduce circuit elements in the direction of the driver. FIG. 5 shows a reduction using string 501 as an example. Again, for simplicity, string 201 of FIG. 2b is used as string 501. Also, similarly, path 572a is used as an example.

Whereas Elmore based embodiments may reduce a path to a simple string (such as simple string 358 of FIG. 3) by setting branching resistances to zero, O'Brien/Savarino influenced methods tolerate branching resistances and incorporate them into the reduction process. In one approach, parallel capacitances (such as capacitors $C_1$, $C_2$ and $C_4$, $C_6$, in string 501 of FIG. 5a) are added in order to form a reduced string (such as reduced string 502 of FIG. 5b). Working from load to source, the reduced string 502 is then reduced further according to an O'Brien/Savarino influenced method. In one embodiment, the O'Brien/Savarino influenced method has two main parts defined by: 1) FIG. 4 in combination with Equations 4a–e, 5a–c; and 2) FIG. 6 in combination with Equations 6a–e, 7a–c. The equations corresponding to FIG. 4 are provided below in Equations 4a–e and 5a–c.

$$R_{new} = \frac{(R_2^2 C_r^3 + 2R_1 R_2 (C_r + C_m)C_r^2 + R_1^2(C_r + C_m)^3)^2}{(R_2 C_r^2 + R_1(C_r + C_m)^2)^3} \quad \text{Equation 4a}$$

$$C_{xmew} = F(C_{xm} + C_{xr}) \quad \text{Equation 4b}$$

$$C_{imew} = F(C_{im} + C_{tr}) \quad \text{Equation 4c}$$

$$C_{xdnew} = (1-F)(C_{xm} + C_{xr}) + C_{xd} \quad \text{Equation 4d}$$

$$C_{idnew} = (1-F)(C_{im} + C_{tr}) + C_{id} \quad \text{Equation 4e}$$

where:

$$C_r = C_{xr} + C_{ir} \text{ and } C_m = C_{xm} + C_{im}, \text{ and} \quad \text{Equ. 5a, 5b}$$

$$F = \frac{1}{1 + \frac{R_2^2 C_r^3 C_m}{(R_2 C_r^2 + R_1(C_r + C_m)^2)^2}} \quad \text{Equation 5c}$$

Figure 6A:
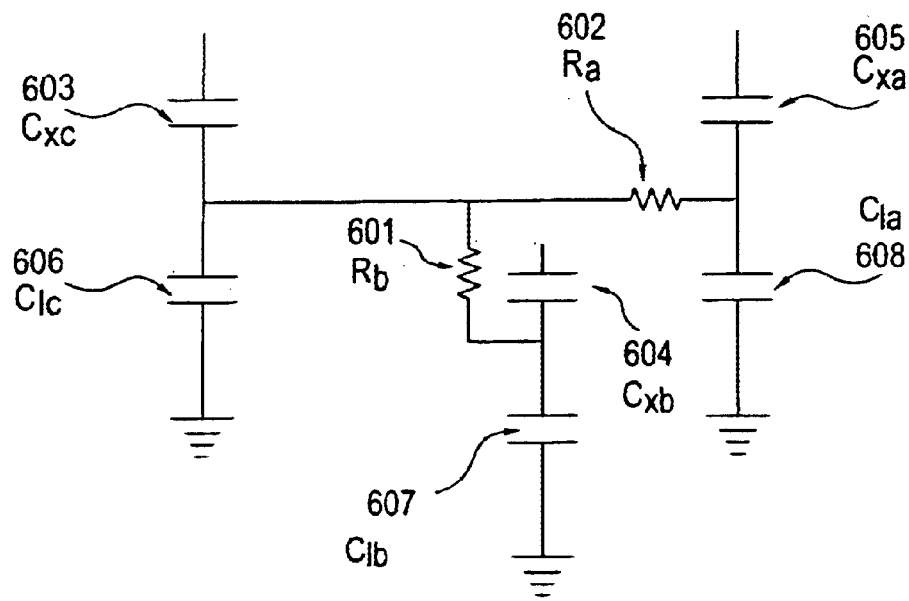
FIG. 6A shows a section of a string having non-zero stub resistance.
Figure 6B:
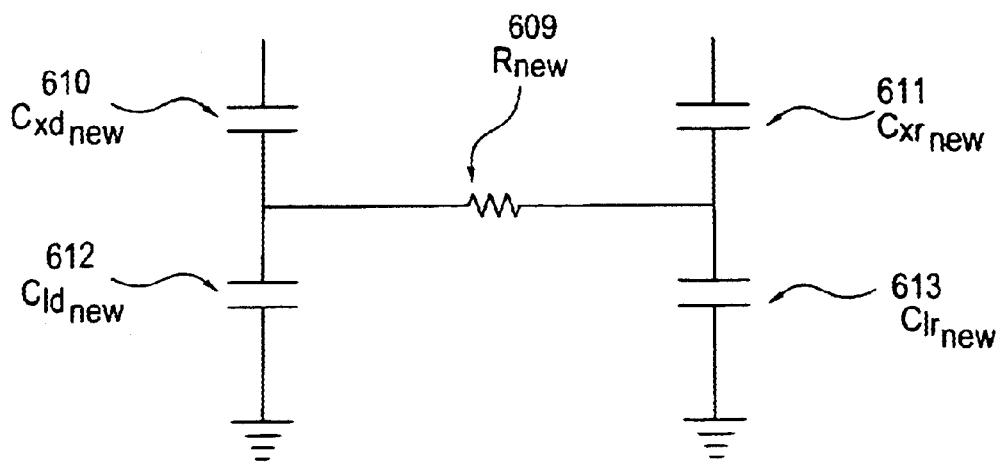
FIG. 6B shows a reduction of the section of FIG. 6A.

Furthermore, if a stub or branching load is encountered, the reduction process shown in FIGS. 6a, 6b is employed where the corresponding equations are as provided below. If there are three or more stubs on a node, then combine them two at a time until a single Pi model remains. Then continue reducing the reduced net toward the driver. Thus an additional aspect of the O'Brien/Savarino influenced method is the use of FIG. 6 and Equations 6a–e, 7a–c as just discussed whenever branches occur.

$$R_{new} = \frac{(R_a^2 C_a^2 + R_b^2 C_b^3)^2}{(R_a C_a^2 + R_b C_b^2)^3} \quad \text{Equation 6a}$$

$$C_{xmew} = G(C_{xa} + C_{xb}) \quad \text{Equation 6b}$$

$$C_{imew} = G(C_{ia} + C_{ib}) \quad \text{Equation 6c}$$

$$C_{xdnew} = (1-G)(C_{xa} + C_{xb}) + C_{xc} \quad \text{Equation 6d}$$

$$C_{idnew} = (1-G)(C_{ia} + C_{ib}) + C_{ic} \quad \text{Equation 6e}$$

where:

$$C_a = C_{xa} + C_{ia} \text{ and } C_b = C_{xb} + C_{ib} \quad \text{Equations 7a, b}$$

$$G = \frac{1}{1 + \frac{C_a C_b (R_a C_a - R_b C_b)^2}{(R_a C_a^2 + R_b C_b^2)^2}} \quad \text{Equation 7c}$$

Thus, as the reduction process is continued from load to source for each path (making new calculations along the way), the reduced string (such as reduced string 502 of FIG. 5) is ultimately reduced to a single pi model for the unique source/load path that was analyzed.

Cross Capacitance Noise Simulation with the Reduced Pi Models

Figure 7A:
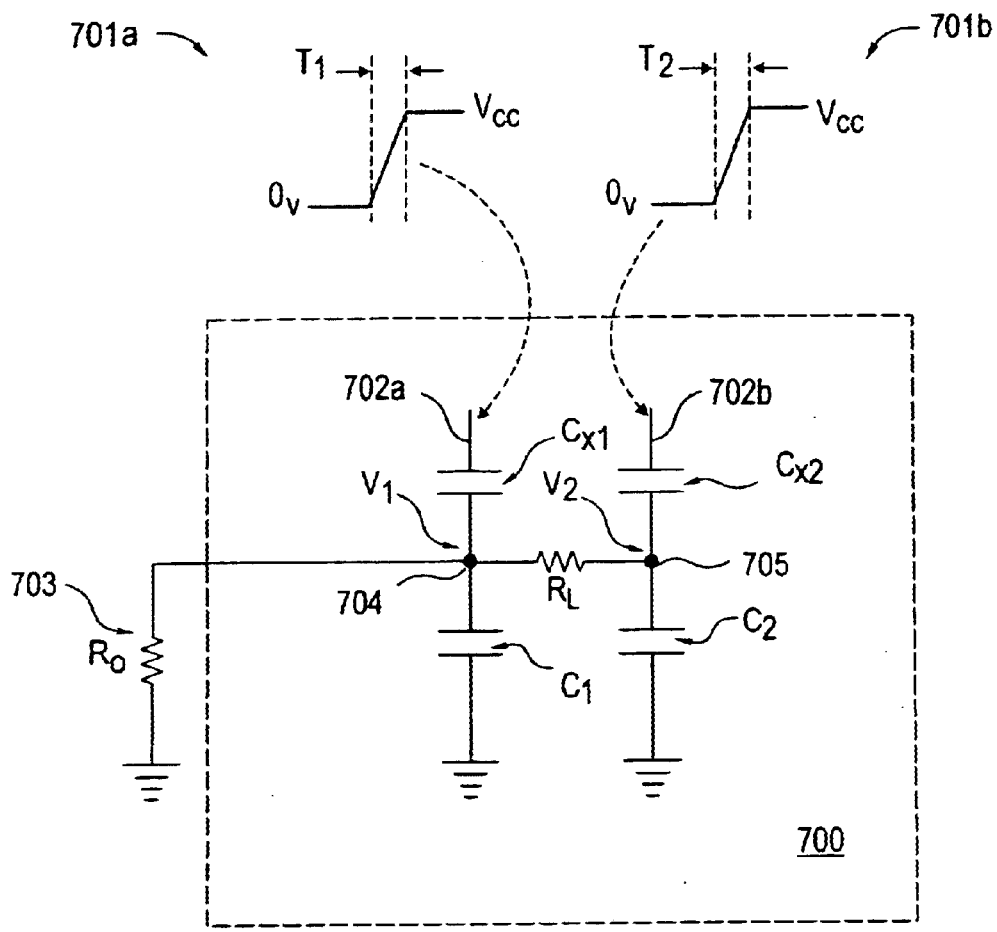
FIG. 7A shows a simulation environment for a single Pi model.

Once the complicated string of a path has been reduced to a simple pi model, noise signals may be introduced at the pi-model's cross-capacitances (e.g., via computer simulation) and their effects on the trace at the source and the load may be studied. FIG. 7a shows a single pi model 700 coupled to a source/driver model 703. Simulations may be run with the equivalent circuit in FIG. 7a. That is, in one embodiment a resistor (e.g. Ro of FIG. 7a) is used to model the path driver transistor and no additional elements model the load since it was incorporated into the Pi model 700 by the reduction process.

Noise voltages 701a, b are then applied at the cross capacitance tips 702a, b (also referred to as attacking nets). Applied noise sources voltages 701a, b are typically simple voltage ramps (e.g., from 0v to Vcc as shown in FIG. 7a) with a rise time duration of T1, T2, respectively. As discussed later, various applied noise types may be applied at the attacking nodes 702a, b. The effects of the applied noise 701a, b are observed at the path's source point 704 and its load point 705. Either of these nodes 704, 705 may be referred to as victim nodes as they are adversely affected by noise introduced from the attacking nodes 702a, b. Applied noise voltages may be worst case signals that could appear on a proximate trace. Worst case signals are those that should induce a large noise voltage on the victim node(s).

For example, the simulator may identify the worst case voltage amplitude (typically Vcc) and shortest ramp time (typically related to device cycle time) that may exist on a neighboring net in actual application. By using these values for the applied noise voltages 701a, b, a worst case scenario may be simulated which provides a high level of confidence that the simulated trace has been properly screened for potential cross capacitance noise problems.

The source model 703 (also referred to as a driver model) is coupled to the source point 704 (also a victim node 704). As discussed in more detail later, the source model 703 may be the driving transistor's source resistance. In the approach of FIG. 7a, the source resistance is grounded because of superposition principles. That is, the effects of the cross capacitance noise are studied individually without specific signals driven by the source transistor onto the path. Thus the voltage source(s) in the simulation embodiment of FIG. 7a are only the applied noise source voltages 701a, b. In other embodiments, the driving transistor's signals may be co-simulated with the noise source voltages 701a, b by adding, for example, a current source in parallel with source resistance Ro.

As discussed, the observed cross capacitance noise appearing at the source point 704 and the load point 705 are each found by superpositioning the effects of applied noise voltages 701*a, b* at each end 704, 705 of the pi model 700. In one approach the noise at the end of the respective ramp times T1, T2 is focused upon. Since cross-capacitance noise originates from sudden voltage changes (such as a rise time voltage swing) the "end-of-ramp" noise is typically the peak noise if the applied noise voltage 701*a* at the source end 702*a* has the same amplitude as the applied noise voltage 701*b* at the load end 702*b*.

The observed "end of ramp" noise is given by:

$$\frac{Vx}{VCC} = \frac{R_u C_v}{T}\left[1 + \frac{T_A - T_S - 2T_W}{2T_S}e^{-\left(\frac{T_A+T_S}{2T_N}\right)T} - \frac{T_A + T_S - 2T_W}{2T_S}e^{-\left(\frac{T_A-T_S}{2T_N}\right)T}\right] \quad \text{Equation 8}$$

where, referring to FIG. 7, $C_{A1}=C_1+C_{X1}$ and $C_{A2}=C_2+C_{X2}$      Equations 9a, b $T_A=R_O(C_{A1}+C_{A2})+R_L C_{A2}$      Equation 9c $T_N=R_O R_L C_{A1} C_{A2}$      Equation 9d $T_s=\sqrt{T_A^2 - 4T_N}$      Equation 9e and, as provided in Table 1

TABLE 1

| $V_X =$ | Noise | $R_U$ | $C_V$ | T | $T_W$ |
|---|---|---|---|---|---|
| $V_{2A}$ | At load point 705 from applied noise voltage at the source end 701a | $R_0$ | $C_{X1}$ | $T_1$ | 0 |
| $V_{2B}$ | At load point 705 from applied noise voltage at the load end 701b | $R_0 + R_L$ | $C_{X2}$ | $T_2$ | $R_0 R_L C_{A1}/(R_0 + R_L)$ |
| $V_{1A}$ | At source point 704 from applied noise voltage at the source end 701a | $R_0$ | $C_{X1}$ | $T_1$ | $R_L C_{A2}$ |
| $V_{1B}$ | At source point 704 from applied noise voltage at the load end 701b | $R_0$ | $C_{X1}$ | $T_2$ | 0 |

Figure 7B:
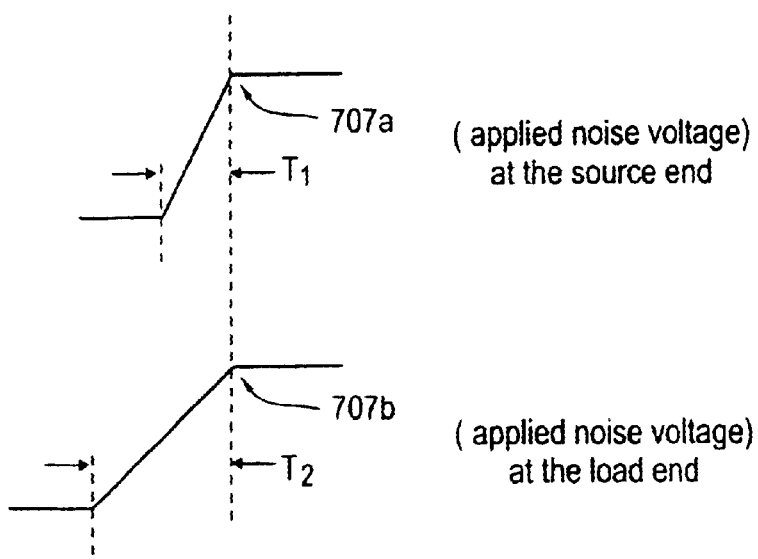
FIG. 7B shows in-phase end of ramp times for applied noise voltages.

Thus, the observed noise voltage at the source point 704 is $V_{1P}=V_{1A}+V_{1B}$, and the observed noise voltage at the load point 705 is $V_{2P}=V_{2A}+V_{2B}$ at the end of the attacking ramp times. These equations correspond to one form of worst case situation (i.e., $V1_p$, $V2_p$ are maximum) where the "end of ramp" 707*a, b* points of the applied noise voltages are in phase. That is, if the ramp ends line up at the same point in time (as shown in FIG. 7*b*), a worst case maximum noise voltage may be observed. The above relationships correspond to such a situation.

The above relationships also correspond to a situation where both ramps reach an amplitude of Vcc (i.e., the supply voltage). Thus Equation 8 uses the term Vcc. More generically, Equation 8 corresponds to a situation where both applied noise voltage ramps 701*a, b* have equal amplitude. Thus, in other situations where Vcc is not the peak voltage but both ramps reach the same amplitude, Equation 8 may still be used provided the Vcc term in Equation 8 is replaced with the appropriate amplitude voltage.

In other cases, the design may involve a worst case situation where applied noise voltage ramps 701*a, b* have different amplitudes or the two cross capacitances $C_{x1}$, $C_{x2}$ have different values resulting in different observed noise voltage amplitudes on the victim nodes 704, 705. In such a case, due to the voltage imbalance on the victim nodes 704, 705 across the pi model resistor $R_1$ of FIG. 7, the peak noise voltages on the victim nodes 704, 705 may occur after the ramp end time. The conditions for this imbalance may be expressed as:

$V_{1P}>V_{2P}$ for the load point 705      Equation 10a $V_{2P} > \frac{R_O + R_L}{R_O} V_{1P}$ for the source point 704      Equation 10b Either or none of the above conditions can occur (but not both), so one of the noise voltages on a victim node may need correction. The first step is to calculate the time when peak voltage occurs. The following gives the time, after the end of the ramp, where the noise peaks:

$$T_P = \frac{T_N}{T_s}\ln\left[\left(\frac{T_A + T_S}{T_A - T_S}\right)\left(\frac{(T_A - T_S - 2T_X)V_A + 2T_Y V_B}{(T_A + T_S - 2T_X)V_A + 2T_Y V_B}\right)\right] \quad \text{Equation 11}$$

where Equations 9a–e are used together with Table 2 (below) to calculate the corresponding variables for $V_{1MAX}$ and $V_{2MAX}$.

TABLE 2

| $V_{MAX} =$ | Noise | $V_A$ | $V_B$ | $T_X$ | $T_Y$ |
|---|---|---|---|---|---|
| $V_{2max}$ | At load point 705 | $V_{2P}$ | $V_{1P}$ | $R_0 C_{A1}$ | $R_0 C_{A1}$ |
| $V_{1max}$ | At source point 704 | $V_{1P}$ | $V_{2P}$ | $(R_0 + R_L)C_{A1}$ | $R_0 C_{A2}$ |

$T_p$ may be substituted into the following expression to find the true peak noise voltage at either the driver ($V_{1MAX}$) or receiver ($V_{2MAX}$):

$$V_{max} = \left(\frac{T_A + T_s - 2T_X}{2T_S}V_A + \frac{T_Y}{T_S}V_B\right)e^{-\frac{(T_A - T_S)T_P}{2T_N}} - \left(\frac{T_A - T_s - 2T_X}{2T_S}V_A + \frac{T_Y}{T_S}V_B\right)e^{-\frac{(T_A + T_S)T_P}{2T_N}} \quad \text{Equation 12}$$

Figure 7C:
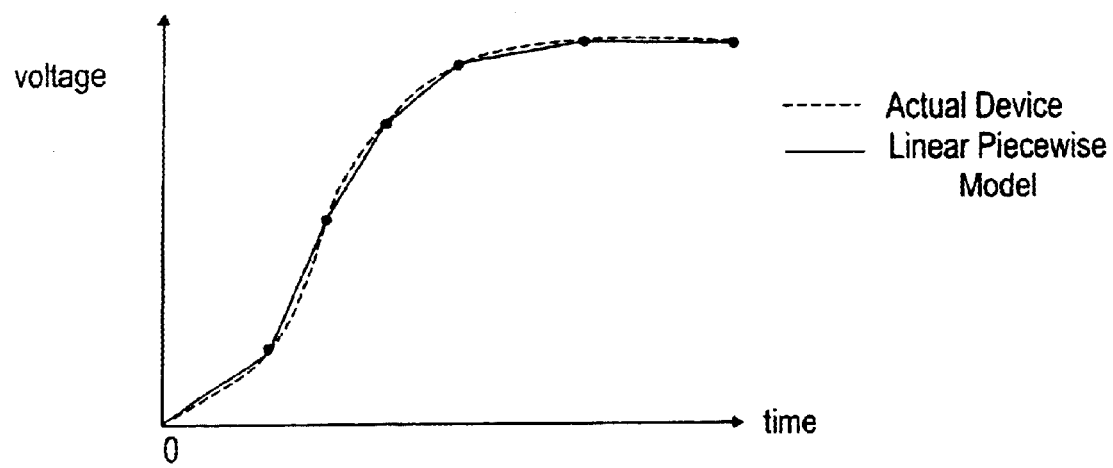
FIG. 7C shows an example of a piecewise linear noise voltage function.
Figure 7D:
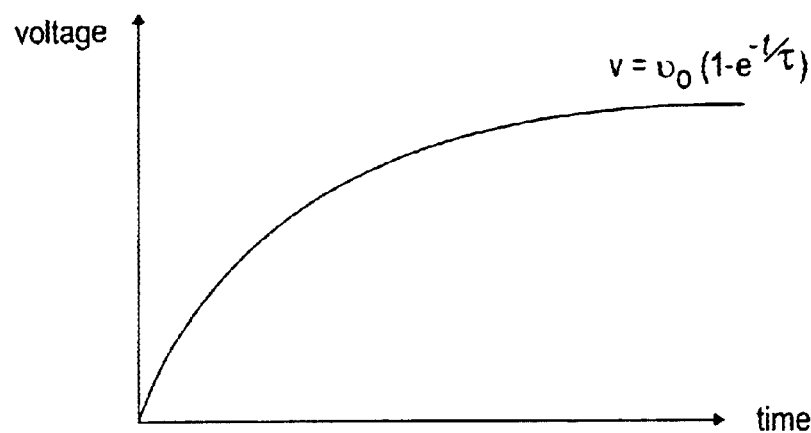
FIG. 7D shows an example of an exponential noise voltage function.

Those of ordinary skill will be able to calculate appropriate models for other scenarios such as ramp voltage end times that are not in phase. Also, other embodiments may employ other noise voltage functions besides ramps such as piecewise linear (an example of which is shown in FIG. 7*c*) and exponential (an example of which is shown in FIG. 7*d*).

Once the peak noise voltages are calculated via simulation, the engineer may evaluate whether a cross capacitance noise problem potentially exists on the particular path being simulated. If a potential problem is observed, the engineer may then, for example, alter the transistor level design or the layout of the trace to properly reduce the cross capacitance noise.

Additional Corrections for CMOS Drivers

Figure 8A:
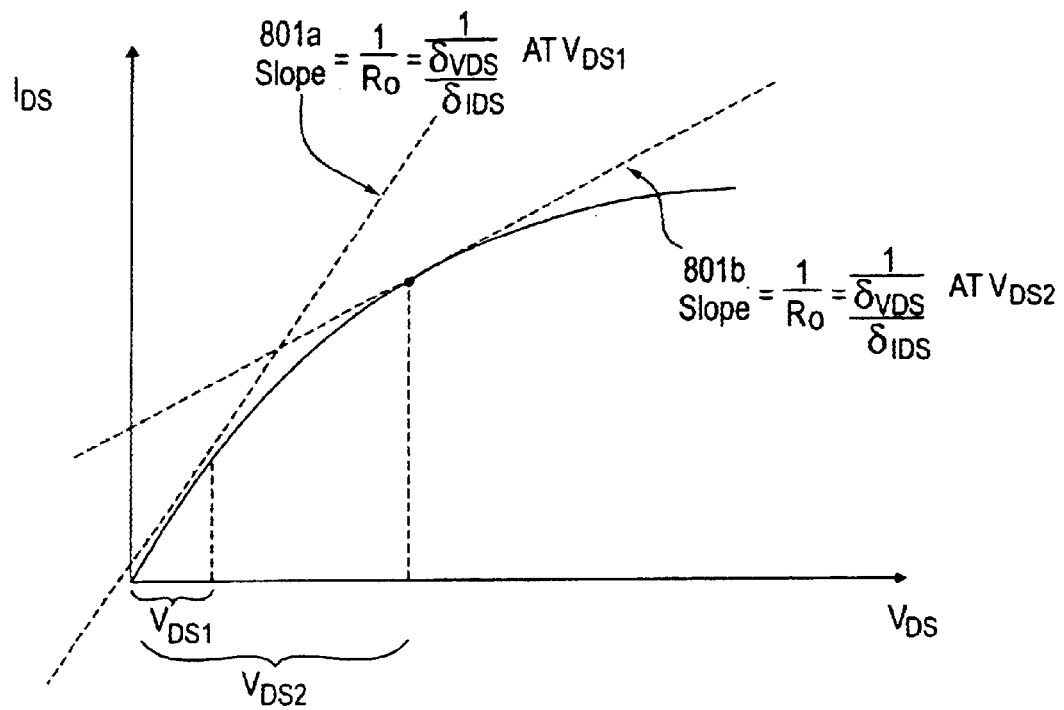
FIG. 8A shows source resistance as a function of $V_{DS}$.

Note that FIG. 7*a* shows the source model 703 of the driving transistor modeled as a linear resistance, Ro. This is proper for some technologies (such as BiCMOS or Bipolar), however, CMOS drivers or other FET drivers (having noticeably non linear source resistance) may require additional consideration. For example, as shown in FIG. 8*a*, the drain-to-source resistance (i.e., the source resistance) 801*a*, b of a CMOS driver can gradually increase as Vds increases. This is a non linearity which may lead to an optimistic noise voltage for linear Ro based simulations if the value of Ro employed is too low. To prevent this, in one embodiment, linear Ro based simulations of CMOS driven paths should use values of Ro that correspond to the driver drain current at the maximum noise voltage to be allowed. That is, the employed value of Ro corresponds to a Vds value equal to the maximum noise allowed at the driving node. This approach, however, may lead to a pessimistic noise voltage. Those of ordinary skill can determine an appropriate correction factor if necessary.

Figure 8B:
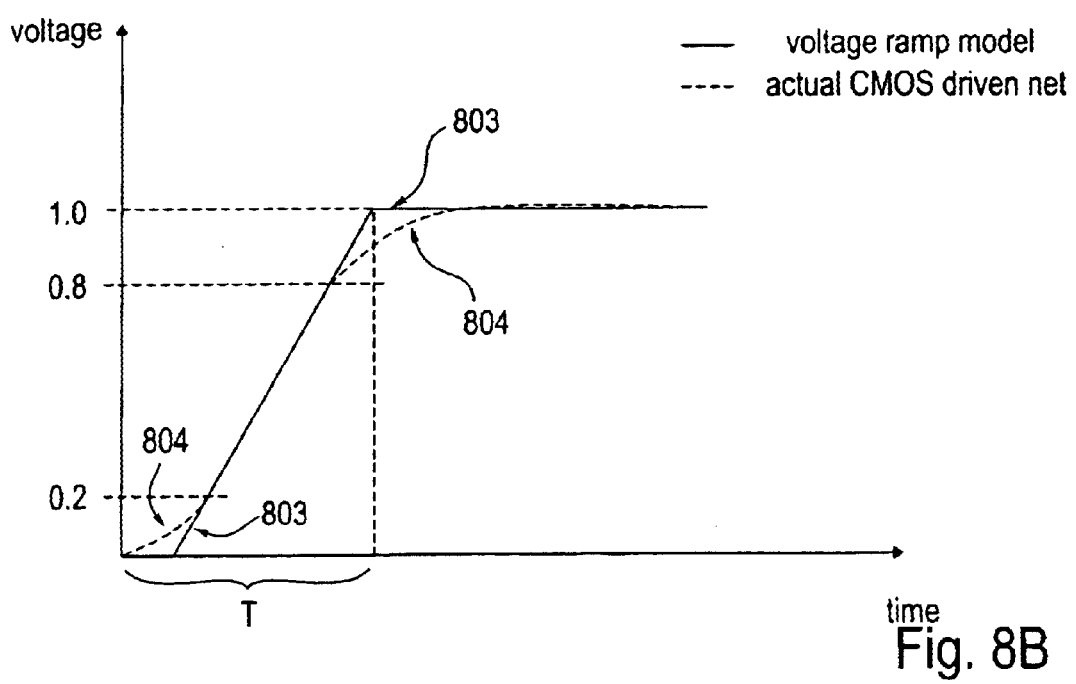
FIG. 8B compares a ramp function with the actual rise of a signal driven by a CMOS driver.

Furthermore, in relation to the applied noise voltages 701a, b of FIG. 7, it is assumed that these noise voltages are also driven by a CMOS driver. So far, the discussion has concerned perfect ramps to model these noise voltages 701a, b. As shown in FIG. 8b, a ramp 803 is used to approximate a logic level voltage during its rise time. However, FIG. 8b also shows the actual rise time signal 804 that is more typical with CMOS driven nets. The actual slope will normally be measured between two points on the waveform, for example the 20% and 80% points of the attacking driver. While a CMOS output is relatively linear up to the 80% point, after this the ramp drops off quickly and is less effective at inducing noise in the victim. To account for this effect, the applied noise voltage ramp times (T1, T2 of FIG. 7) should be multiplied by a factor (1.2 to 1.25 for example) to approximate the noise effect of an actual CMOS waveform.

Multiple Neighboring Traces

So far the discussion has been limited to modeling the effects caused by a single neighboring trace. That is, referring to FIGS. 1a, 1f trace 102b is the trace being modeling, only the effects of signals traveling on trace 102a are observed during the modeling analysis of trace 102b. However, as shown in FIG. 9a, semiconductor IC wiring frequently involves multiple traces 902a, b, c, d within sufficient proximity of each other to cause cross capacitance induced noise.

In order to address multiple noise sources that originate from multiple corresponding proximate traces, the basic lumped element models may be modified, as shown in FIG. 9b. FIG. 9b shows a lumped element model 903 for a simple length of trace length (e.g., trace length 902a of FIG. 9a) having proximate traces (such as traces 902b, c, d of FIG. 9a). By comparison, whereas trace length model 202b of FIG. 2b only has one cross capacitance pair 208a, 208b, (resulting in one cross capacitance per node), model 903 of FIG. 9b has three cross capacitances (such as cross capacitors 901b, c, d) per node. This follows since each neighboring trace 902b, c, d (referring briefly back to FIG. 9a) is cross coupled to trace 902a and therefore may act as noise source relative to trace 902a. Thus multiple coupled traces involve more complicated lumped element models having multiple cross capacitances per node. Multiple cross capacitance nodes may be used not only for simple trace lengths (such as that shown in FIG. 9b), but are also used for bends, stubs, etc. as well.

Multiple cross capacitances per node result in more complicated strings. That is, referring to FIG. 2b, if string 201 had three cross capacitances per node the string 201 would have three times the number of cross capacitors 208. The circuit simplification process (to reduce the string to a simple pi model) is therefore further complicated as well. For strings comprising multiple cross capacitances per node, (stemming from multiple trace couplings) the string simplification process requires additional steps as compared to strings having one cross capacitance per node.

The additional step comprises adding the multiple cross capacitances together to form a single cross capacitor (e.g., capacitor 904 as shown in FIG. 9c) per node as shown. This results in a lumped element model corresponding to a single proximate trace. Once the multiple cross capacitances have been added for each lumped element within a string having multiple cross capacitances per node, a simple string is eventually created. The reduction process then follows as discussed previously.

The adding of multiple capacitances is an approximation since these capacitances are not truly in parallel. However, an adjustment is made to the applied noise voltages once the single pi model is reached that compensates for this approximation. Specifically, an equivalent noise voltage source that accounts for each of the multiple noise sources (i.e., traces 902b, c, d) is applied to the cross capacitance tips of the pi model.

Figure 10A:
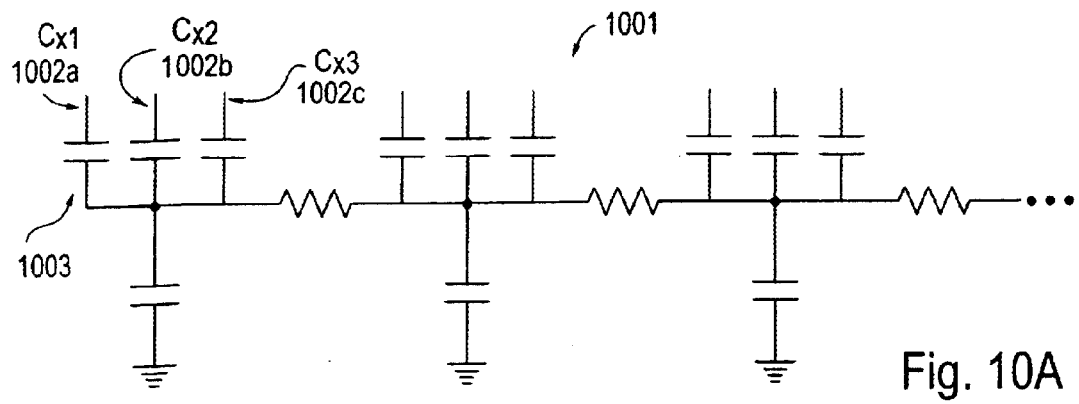
FIG. 10A shows a string that corresponds to the proximate conducting trace environment of FIG. 9A.
Figure 10B:
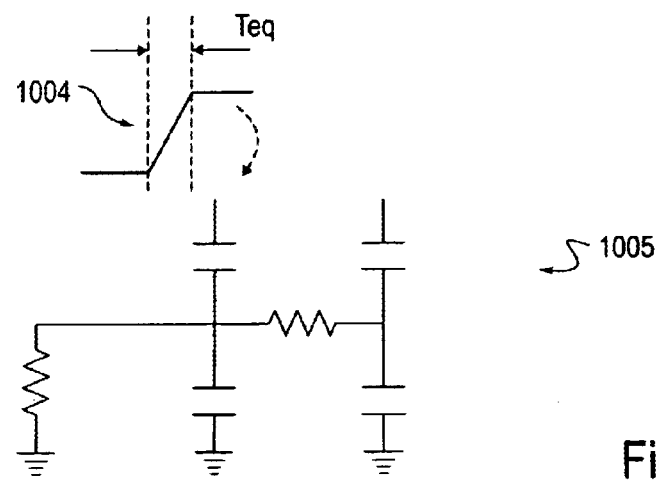
FIG. 10B shows the application of an applied noise voltage having an equivalent ramp time.
Figure 10C:
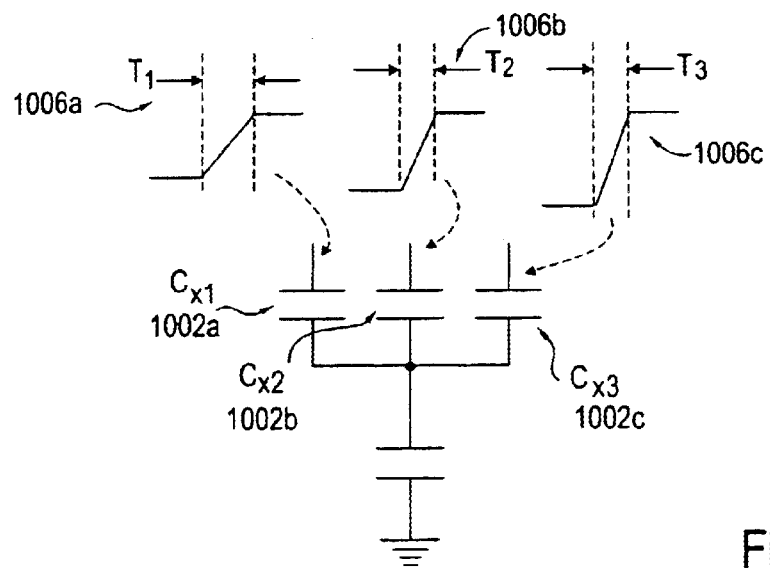
FIG. 10C shows unique cross capacitances and their associated worst case applied noise voltages used for calculating the equivalent ramp time of FIG. 10B.
Figure 11:
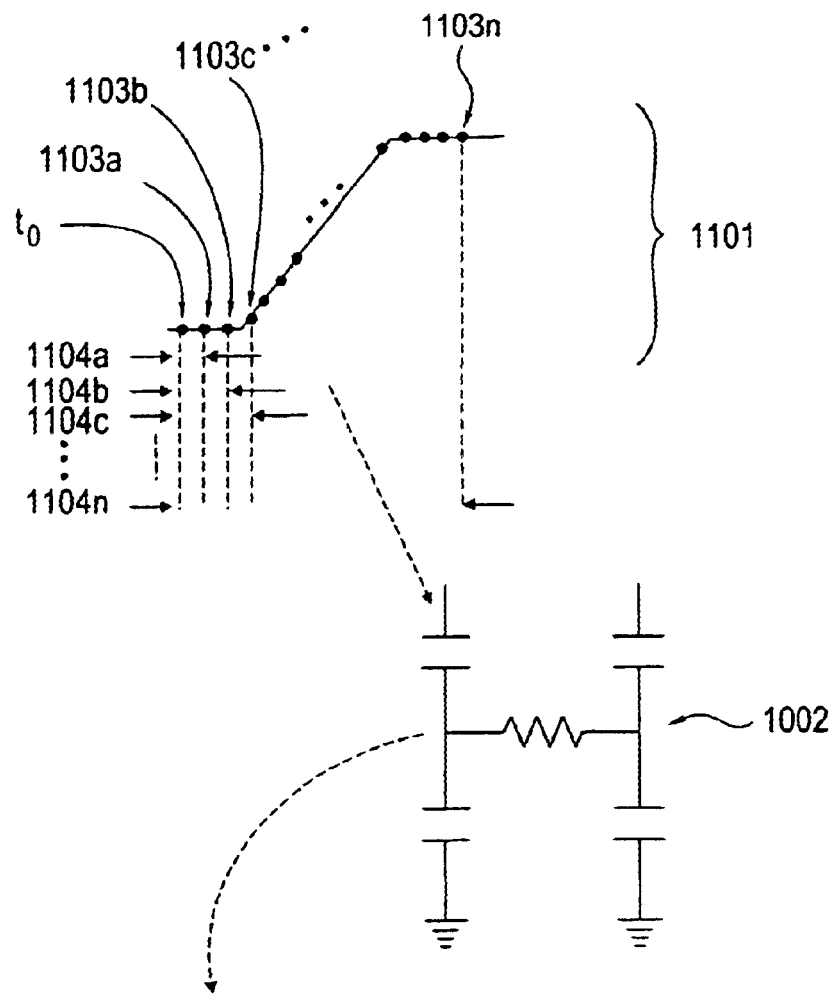
Figure 11:
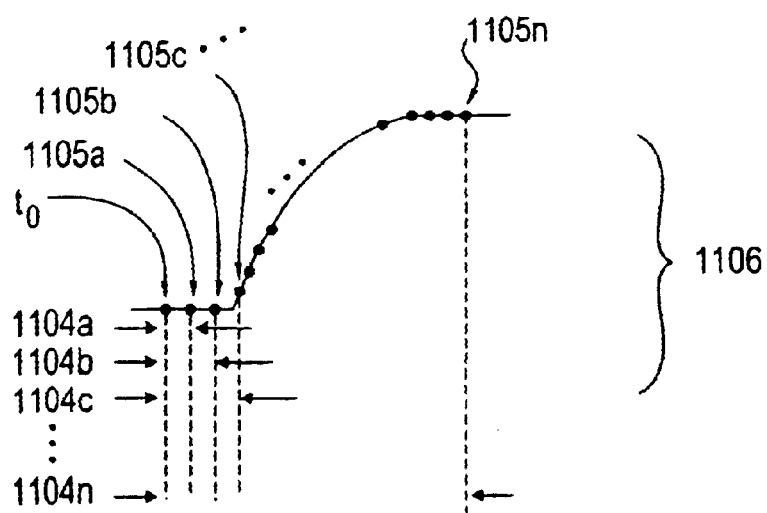

The adjustment is demonstrated in FIG. 10. Again, the structure of FIG. 9a serves as the basis for this example. FIG. 10a shows a string 1001 (i.e., the lumped element model of the trace before any reductions are made) having unique cross capacitances 1002a, b, c at the source end 1003 of the string 1001. Referring to FIG. 10b, the applied noise voltage at the source 1004a, used with the simple pi model 1005 (once its obtained after reduction of the string 1001), has an equivalent ramp time Teq.

Referring to FIG. 9c, Teq is obtained from the worst case signal 1006a, b, c from each of the neighboring traces is. Each signal 1006a, b, c may have its own unique ramp time (such as ramp times T1, T2 and T3). The individual cross capacitance values 1002a, b, c at the source end 1003 of the string 1001 are then used to calculate the equivalent applied noise voltage ramp time (i.e., Teq of FIG. 3b) according to Equation 13, below. Note that these cross capacitance 1002a, b, c values have already been added together and incorporated in the single pi model 1005 of the path. However, for purposes of adjusting the applied noise voltage ramp time, their independence is utilized.

$$T_{eq} = \frac{C_{X1} + C_{X2} + C_{X3} + \ldots}{\frac{C_{X1}}{T_1} + \frac{C_{X2}}{T_2} + \frac{C_{X3}}{T_3} + \ldots}$$

Equation 13

The same analysis may be used at the load end as well. That is, the individual cross capacitance values appearing at the load end of the string are used to generate an effective applied noise voltage ramp time. It is assumed that the attacking ramps all coincide at the same peak ramp time to produce worst case noise. Also, note that Equation 13 is general. That is, Equation 13 applies to situations having more or less than three cross capacitances per node as seen in FIG. 10.

Noise Waveform Generation

The single pi model approach may also be used to generate noise waveforms generated at the driver and load. That is, so far only noise peak values have been discussed in order to identify the worst case noise peak. However, in other instances in may be useful to know, approximately, the overall appearance of the noise waveform. This is accomplished by incrementing the overall applied voltage ramp 1101 into incremental voltage valves 1103a, b, c, . . . n having associated times 1104a, b, c, . . . n. By using the aforementioned analyses within the pi model 1102, a corresponding incremental noise voltage 1105a, b, c, . . . n is produced for each incremental time 1104a, b, c, . . . n. The collection of noise voltages 1105a, b, c, . . . n may be plotted against their corresponding times 1104a, b, c, . . . n to produce the overall noise voltage waveform 1106. For each noise voltage waveform 1106, the incremented noise sources may include both the source noise voltage and the load noise voltage or either of these alone depending on the specific purpose of the waveform study.

Design Tool Environment

The aforementioned methods may be executed within a number of different design tool environments. Design tools are computer programs used to implement a circuit design into hardware. For example, the simulations of the pi model response to the applied noise voltages may be run on SPICE based simulators (such as PSPICE for personal computing systems or HSPICE for workstations). Simulations are computer based executions of circuit models in order to model circuit operation. For SPICE based simulations, a spice model of the pi model and the applied noise voltages may be created. However, the simulations may also be performed on other types of simulators such as proprietary/in-house simulation environments.

The trace model (i.e., string) may be obtained or derived from the netlist information contained within the layout design tool. Various commercial layout tools (such as CELL3™ OR IC Craftsmen™ by CADENCE™ or other tools by MENTOR™) as well as proprietary tools exist. Software that executes the reduction processes may be written to help port the trace model information (from the layout netlist) to the pi model (for use in the simulator). This is true in environments where simulation is performed on a separate tool from the layout as well as in tool environments where layout and simulation is integrated.

Design tools are typically implemented with machine readable media. A machine-readable medium includes any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

What is claimed is:

1. A machine-readable medium having stored thereon instructions, which when executed by one or more processors, cause said one or more processors to perform a method, said method comprising:
   a) creating a string that models a trace having cross-capacitance, said string having a collection of lumped elements including cross capacitors;
   b) reducing said string to a pi model, said pi model having a pair of cross capacitors; and
   c) simulating the application of an applied noise voltage to at least one of said cross capacitors.

2. The machine-readable medium of claim 1 wherein said reducing said string to a pi model further comprises reducing the number of capacitors and resistors in said string.

3. The machine-readable medium of claim 2 wherein said reducing said string to a pi model further comprises reducing six capacitors and two resistors in said string to four capacitors and one resistor.

4. The machine-readable medium of claim 3 wherein said reduction of six resistors and four capacitors is performed according to an Elmore influenced reduction method.

5. The machine-readable medium of claim 3 wherein said reduction of resistors and capacitors is performed according to an O'Brien/Savarino influenced reduction method.

6. The machine-readable medium of claim 1 wherein said string further comprises a number of paths, said reduction of said string to a pi model performed for one of said paths.

7. The machine-readable medium of claim 1 wherein said application of a noise voltage further comprises applying a voltage ramp as said applied noise voltage.

8. The machine-readable medium of claim 7 wherein the ramp time of said voltage ramp is multiplied by a factor to correct for the characteristics of an actual driving transistor.

9. The machine-readable medium of claim 1 wherein said instructions are such that said reducing said string to a pi model may be performed on a first apparatus and said creating a string that models a trace may be performed on a second apparatus.

10. The machine-readable medium of claim 1 wherein said method further comprises adding a resistor to said pi model as a linear source model.

11. The machine-readable medium of claim 1 said method further comprises allowing a user to observe a noise voltage waveform on a victim node of said pi model.

12. The machine-readable medium of claim 1 wherein said method further comprises calculating the peak noise voltage on a victim node of said pi model caused by said applied noise voltage.

13. The machine-readable medium of claim 1 wherein said method further comprises applying a second applied noise voltage to a second cross capacitor of said cross capacitors.

14. The machine-readable medium of claim 13 wherein said applied noise voltage and said second applied noise voltage are voltage ramps having their end or ramp times in phase.

15. The machine-readable medium of claim 13 wherein said method further comprises calculating the peak noise caused by said applied noise voltage and said second applied noise voltage at a source point of said pi model.

16. The machine-readable medium of claim 13 wherein said method further comprises calculating the peak noise caused by said applied noise voltage and said second applied noise voltage at a load point of said pi model.

17. The machine-readable medium of claim 1 wherein said reducing said string to a pi model further comprises reducing said string to a reduced string then reducing said reduced string to a simple string having resistors in series and capacitors in parallel, said capacitors separated by one of said resistances, then reducing said simple string to a pi-model.

18. A machine-readable medium having stored thereon instructions, which when executed by one or more processors, cause said one or more processors to perform a method, said method comprising:
   a) creating a string that models a trace having cross-capacitance, said string having a collection of lumped elements, at least one of said lumped elements having a plurality of cross capacitors on a node, each of said cross capacitors corresponding to a different proximate trace;
   b) adding said plurality of cross capacitors together to form a reduced string;
   c) reducing said reduced string to a pi model, said pi model having a cross capacitor; and
   d) simulating the application of an applied noise voltage to said cross capacitor.

19. The machine-readable medium of claim 18 wherein said reducing said reduced string to a pi model further comprises reducing the number of capacitors and resistors in said reduced string.

20. The machine-readable medium of claim 19 wherein said reducing said reduced string to a pi model further comprises reducing six capacitors and two resistors in said string to four capacitors and one resistor.

21. The machine-readable medium of claim 20 wherein said reduction of six resistors and four capacitors is performed according to an Elmore influenced reduction method.

22. The machine-readable medium of claim 20 wherein said reduction of resistors and capacitors is performed according to an O'Brien/Savarino influenced reduction method.

23. The machine-readable medium of claim 18 wherein said string further comprises a number of paths, said reduction of said string to a pi model performed for one of said paths.

24. The machine-readable medium of claim 18 wherein said applying a noise voltage further comprises applying a voltage ramp as said applied noise voltage.

25. The machine-readable medium of claim 24 wherein said voltage ramp further comprises an equivalent ramp time that approximates the worst case noise caused by said plurality of proximate traces.

26. The machine-readable medium of claim 18 wherein said reducing said reduced string to a pi model may be performed on a first apparatus and said creating a string that models a trace may be performed on a second apparatus.

27. The machine-readable medium of claim 18 wherein said reducing said reduced string to a pi model further comprises reducing said reduced string to a simple string then reducing said simple string to a pi-model.

28. An apparatus, comprising:
a computer having design tool software, said design tool software comprised of instructions that when executed cause a method to be performed, said method comprising:
a) recognizing a string that models a trace having cross-capacitance, said string having a collection of lumped elements including cross capacitors;
b) reducing said string to a pi model, said pi model having a pair of cross capacitors; and
c) simulating the application of an applied noise voltage to at least one of said cross capacitors.

29. A machine-readable medium having stored thereon instructions which when executed by one or more processors cause said one or more processors to perform a method, said method comprising:
calculating a plurality of incremental values from an overall applied noise voltage waveform and simulating the application of each of said plurality of incremental values to a cross capacitor, said cross capacitor one of a pair of cross capacitors associated with a pi model, said pi model reduced from a string having more than a pair of cross capacitors.

30. The machine-readable medium of claim 29 wherein said method further comprises assembling a plurality of observed noise voltages from the simulation of the application of each of said discrete samples.

31. The machine-readable medium of claim 30 wherein said method further comprises displaying an overall observed noise voltage waveform produced from said plurality of observed noise voltages.

32. The machine-readable medium of claim 29 wherein said overall applied noise voltage waveform is a ramp.

33. A method, comprising:
a) creating a string that models a trace having cross-capacitance, said string having a collection of lumped elements including cross capacitors;
b) reducing said string to a pi model, said pi model having a pair of cross capacitors; and
c) simulating the application of an applied noise voltage to at least one of said cross capacitors.

34. The method of claim 33 wherein said reducing said string to a pi model further comprises reducing the number of capacitors and resistors in said string.

35. The method of claim 34 wherein said reducing said string to a pi model further comprises reducing six capacitors and two resistors in said string to four capacitors and one resistor.

36. The method of claim 35 wherein said reduction of six resistors and four capacitors is performed according to an Elmore influenced reduction method.

37. The method of claim 35 wherein said reduction of resistors and capacitors is performed according to an O'Brien/Savarino influenced reduction method.

38. The method of claim 33 wherein said string further comprises a number of paths, said reduction of said string to a pi model performed for one of said paths.

39. The method of claim 33 wherein said application of a noise voltage further comprises applying a voltage ramp as said applied noise voltage.

40. The method of claim 39 wherein the ramp time of said voltage ramp is multiplied by a factor to correct for the characteristics of an actual driving transistor.

41. The method of claim 33 wherein said reducing said string to a pi model is performed on a first apparatus and said creating a string that models a trace is performed on a second apparatus.

42. The method of claim 33 further comprising adding a resistor to said pi model as a linear source model.

43. The method of claim 33 further comprising observing noise voltage on a victim node of said pi model.

44. The method of claim 33 further comprising calculating the peak noise voltage on a victim node of said pi model caused by said applied noise voltage.

45. The method of claim 33 further comprising applying a second applied noise voltage to a second cross capacitor of cross capacitors.

46. The method of claim 45 wherein said applied noise voltage and said second applied noise voltage are voltage ramps having their end or ramp times in phase.

47. The method of claim 45 further comprising calculating the peak noise caused by said applied noise voltage and said second applied noise voltage at a source point of said pi model.

48. The method of claim 45 further comprising calculating the peak noise caused by said applied noise voltage and said second applied noise voltage at a load point of said pi model.

49. The method of claim 33 wherein said reducing said string to a pi model further comprises reducing said string to a reduced string then reducing said reduced string to a simple string having resistors and capacitors in parallel, said capacitors separated by one of said resistors then reducing said simple string to a pi-model.

50. A method, comprising:
a) creating a string that models a trace having cross-capacitance, said string having a collection of lumped elements, at least one of said lumped elements having a plurality of cross capacitors on a node, each of said cross capacitors corresponding to a different proximate trace;
b) adding said plurality of cross capacitors together to form a reduced string;
c) reducing said reduced string to a pi model, said pi model having a cross capacitor; and
d) simulating the application of an applied noise voltage to said cross capacitor.

51. The method of claim 50 wherein said reducing said reduced string to a pi model further comprises reducing the number of capacitors and resistors in said reduced string.

52. The method of claim 51 wherein said reducing said reduced string to a pi model further comprises reducing six capacitors and two resistors in said string to four capacitors and one resistor.

53. The method of claim 52 wherein said reduction of six resistors and four capacitors is performed according to an Elmore influenced reduction method.

54. The method of claim 52 wherein said reduction of resistors and capacitors is performed according to an O'Brien/Savarino influenced reduction method.

55. The method of claim 50 wherein said string further comprises a number of paths, said reduction of said string to a pi model performed for one of said paths.

56. The method of claim 50 wherein said applying a noise voltage further comprises applying a voltage ramp as said applied noise voltage.

57. The method of claim 56 wherein said voltage ramp further comprises an equivalent ramp time that approximates the worst case noise caused by said plurality of proximate traces.

58. The method of claim 50 wherein said reducing said reduced string to a pi model is performed on a first apparatus and said creating a string that models a trace is performed on a second apparatus.

59. The method of claim 50 wherein said reducing said reduced string to a pi model further comprises reducing said reduced string to a simple string then reducing said simple string to a pi-model.

60. A method, comprising:

calculating a plurality of incremental values from an overall applied noise voltage waveform and simulating the application of each of said plurality of incremental values to a cross capacitor, said cross capacitor one of a pair of cross capacitors associated with a pi model, said pi model reduced from a string having cross-capacitance said string having more than a pair of cross capacitors.

61. The method of claim 60 further comprising assembling a plurality of observed noise voltages from the simulation of the application of each of said incremental values.

62. The method of claim 61 further comprising displaying an overall observed noise voltage waveform produced from said plurality of observed noise voltages.

63. The method of claim 60 wherein said overall applied noise voltage waveform is a ramp.

* * * * *

UNITED STATES PATENT AND TRADEMARK OFFICE
CERTIFICATE OF CORRECTION

PATENT NO. : 6,853,967 B1
DATED : February 8, 2005
INVENTOR(S) : Roberts

It is certified that error appears in the above-identified patent and that said Letters Patent is hereby corrected as shown below:

Column 1,
Line 35, delete "110a" and insert -- 1O1a --.

Column 2,
Line 19, delete "a" and insert -- as --.

Column 5,
Line 6, delete "232ab" and insert -- 232a,b --.
Line 19, delete "$E_1$" and insert -- Elmore --.

Column 6,
Line 6, delete "R and $R_1$" and insert -- $R_1$ and $R_4$ --.
Line 41, insert -- Rnew=$R_1$+$R_2$ Equation 3a --.

Column 9,
Line 27, delete "$T_s = \sqrt{T_A^2 - 4T_N}$" and insert -- $Ts = \sqrt{T_A^2 - 4T_N}$ --

Line 42, delete "$C_{x1}$" and insert -- $C_{x2}$ --.

Column 10,
Line 34, delete "$C_{A1}$" and insert -- $C_{A2}$ --.

Column 18,
Line 14, after "capacitance", insert -- , --.

Signed and Sealed this

Thirty-first Day of May, 2005

JON W. DUDAS
*Director of the United States Patent and Trademark Office*